United States Patent [19]

Tsujide

[11] Patent Number: 4,481,524

[45] Date of Patent: Nov. 6, 1984

[54] SEMICONDUCTOR MEMORY DEVICE HAVING STACKED POLYCRYSTALLINE SILICON LAYERS

[75] Inventor: Tohru Tsujide, Tokyo, Japan

[73] Assignee: Nippon Electric Co., Ltd., Tokyo, Japan

[21] Appl. No.: 359,018

[22] Filed: Mar. 18, 1982

Related U.S. Application Data

[63] Continuation of Ser. No. 114,162, Jan. 22, 1980, abandoned.

[30] Foreign Application Priority Data

Jan. 23, 1979 [JP] Japan .................................. 54-6925

[51] Int. Cl.³ .................... H01L 27/02; H01L 29/34; H01L 29/04; G11C 11/00
[52] U.S. Cl. ....................................... 357/42; 357/54; 357/59; 365/156; 307/238.8
[58] Field of Search ...................... 357/41, 42, 54, 59; 307/238.8; 365/154, 156

[56] References Cited

U.S. PATENT DOCUMENTS

| | | | |
|---|---|---|---|
| 4,132,904 | 1/1979 | Harari | 357/54 |
| 4,209,716 | 6/1980 | Raymond | 357/59 |
| 4,209,797 | 6/1980 | Egawa et al. | 357/59 |
| 4,223,333 | 9/1980 | Masuoka | 357/41 |
| 4,262,340 | 4/1981 | Sasaki et al. | 365/154 |

*Primary Examiner*—Gene M. Munson
*Attorney, Agent, or Firm*—Sughrue, Mion, Zinn, Macpeak & Seas

[57] ABSTRACT

A high-density integrated circuit is disclosed, which comprises at least three stacked wiring layers, the lowest layer being formed of polycrystalline and including silicon gates of a plurality of insulated-gate field-effect transistors, one of the upper layers being formed of polycrystalline silicon and used for feeding a power supply to the transistors, and the other of the upper layers being formed of high-conductivity metal. Where the upper polycrystalline silicon wiring layer is under the metal wiring layer, it is preferably of a mesh-like pattern.

15 Claims, 16 Drawing Figures

□ N-TYPE DIFFUSION REGION
▨ P-TYPE DIFFUSION REGION
▨ 1st LEVEL POLYCRYSTALLINE SILICON
▨ 2nd LEVEL POLYCRYSTALLINE SILICON
▨ ALUMINUM

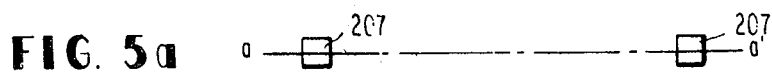
FIG. 5a
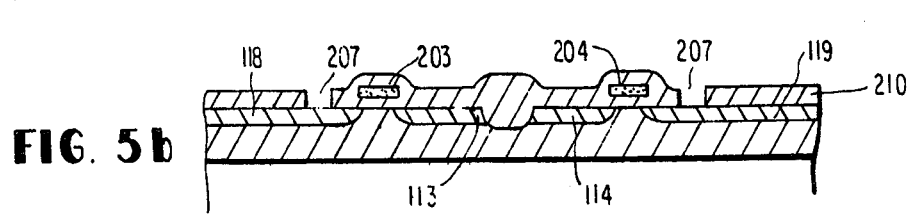
FIG. 5b
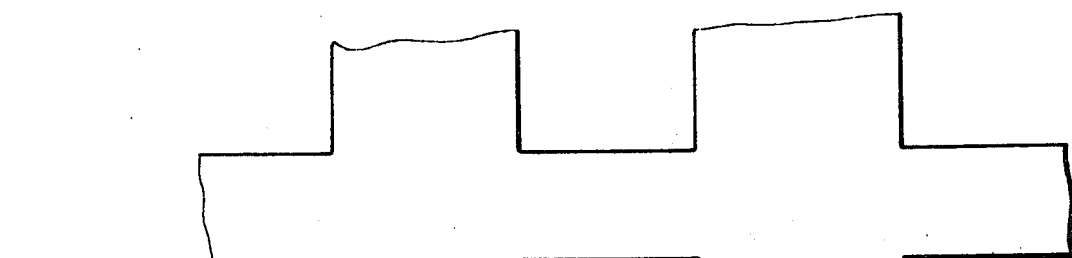
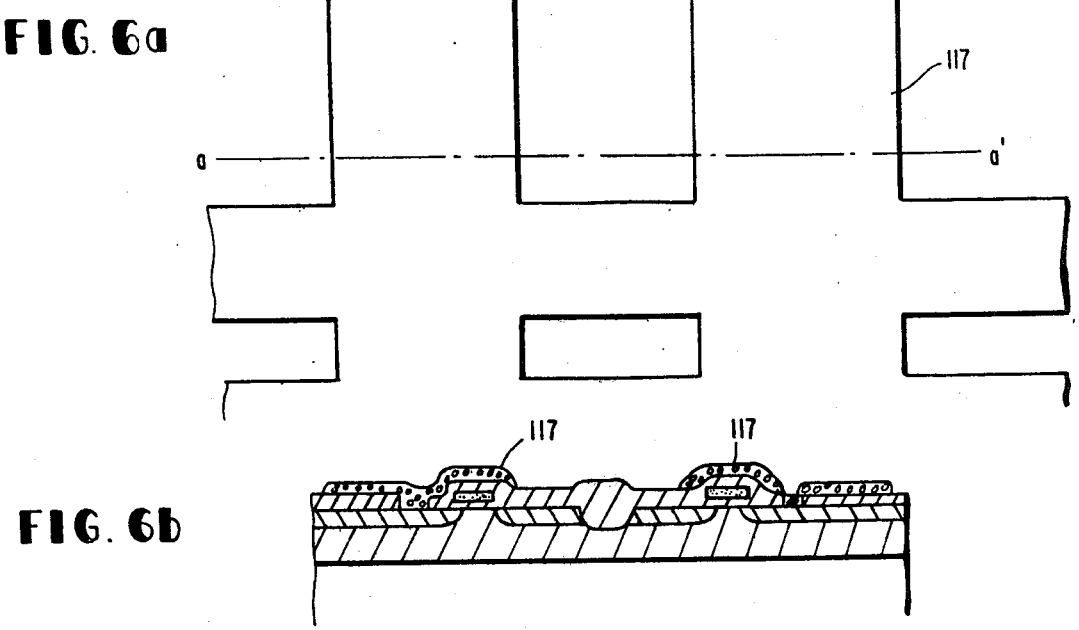
FIG. 6a
FIG. 6b
FIG. 7a
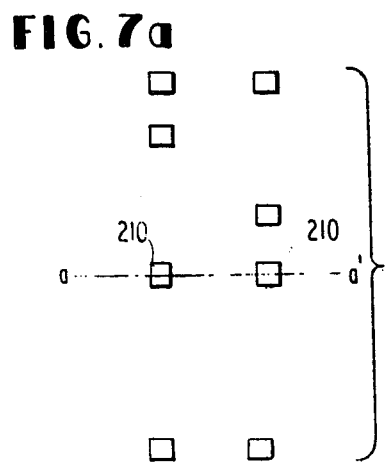
FIG. 7b
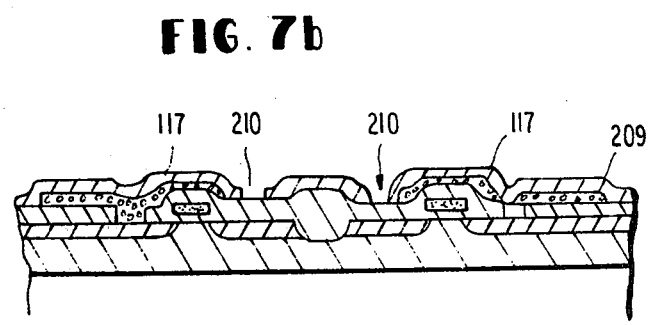

SEMICONDUCTOR MEMORY DEVICE HAVING STACKED POLYCRYSTALLINE SILICON LAYERS

This is a continuation of application Ser. No. 114,162, filed Jan. 22, 1980 now abandoned.

The present invention relates to an integrated circuit and more particularly to an integrated circuit employing insulated-gate field effect transistors.

Memory capacities of semiconductor memory devices have been on the increase in recent years, and it has been urged to reduce the size of memory storage circuits (hereinafter referred to as memory cells).

Increasing demand has also been placed in the market for the development of memory devices having higher performance, and many memory devices featuring small power consumption and high operation speeds have hitherto been announced.

This tendency is conspicuous particularly in regard to static type random access memory (RAM) devices employing complementary type insulated-gate field-effect (CMOS) transistors, and it is foreseen that the CMOS memories employing CMOS transistors will occupy great proportions in the field in the near furture.

In the memory cells employing CMOS transistors, however, the diffusion layers of different conductivity types of two p-channel MOS transistors and two n-channel MOS transistors must be connected to each other by two electrically conductive wiring layers such as of aluminum which is capable of establishing ohmic contact with each of the diffusion layers. Further, electrically conductive layer such as of aluminum having small resistance is usually provided for two digit lines and ground (GND) wiring therein. Besides, to avoid complication in the manufacturing steps, these five aluminum wirings are, in many cases, formed by the same level of layer, as has been disclosed, for example, in ISSCC Digest Technical Paper, p. 18, 1977. When aluminum wirings are arrayed maintaining a pitch of 6 microns, a total width of 30 microns will be necessary to array five aluminum wirings so that it becomes difficult to increase the degree of integration.

It is an object of the present invention to provide an integrated circuit having increased degree of integration.

It is another object of the present invention to provide a semiconductor memory device of large memory capacities.

An integrated circuit according to the present invention comprises a plurality of insulated-gate field-effect transistors and at least three stacked wiring layers, the lowest wiring layer being formed of polycrystalline silicon and including silicon gates of the transistors and one of the upper wiring layers being formed of polycrystalline silicon and serving as a power supply path to the transistors. The other of the upper wiring layer is preferably formed of metal having a high electrical conductivity. Where the upper polycrystalline silicon wiring layer is under the metal wiring layer, its pattern is favorably formed a mesh-like form.

According to the present invention, a high-density of integrated circuit can be obtained. In particular when the present invention is applied to a semiconductor memory device, a large memory capacity can be obtained within a small area.

In a preferred embodiment of the invention, a semiconductor memory device comprises a plurality of memory cells having flip-flop transistors and a gate transistor, a lower wiring layer formed of polycrystalline silicon and including silicon gates of the flip-flop transistors and the gate transistor and word lines for the respective memory cells coupled to the silicon gates of the gate transistors, an upper wiring layer formed of a highly conductive metal and including interconnection of the flip-flop transistors for their cross-coupling and digit lines for each memory cell coupled to the sources or drains of the gate transistors, and another upper wiring layer formed of polycrystalline silicone positioned principally under or above the upper metal wiring layer and above the lower polycrystalline silicon layer and serving as a power supply path to the flip-flop transistors. The upper polycrystalline layer favorably has a mesh-like shape and is coupled to the flip-flop transistors and to a power supply terminal to which a power source is to be connected.

BRIEF DESCRIPTION OF THE DRAWINGS

FIGS. 3 to 8 are diagrams illustrating the steps for producing the integrated circuit of FIG. 2, in which diagrams (A) of FIGS. 3 to 8 are plan views showing patterns, and diagrams (B) of FIGS. 3 to 8 are cross-sectional views along the lines a-a' of the diagrams (A):

Figure 1:
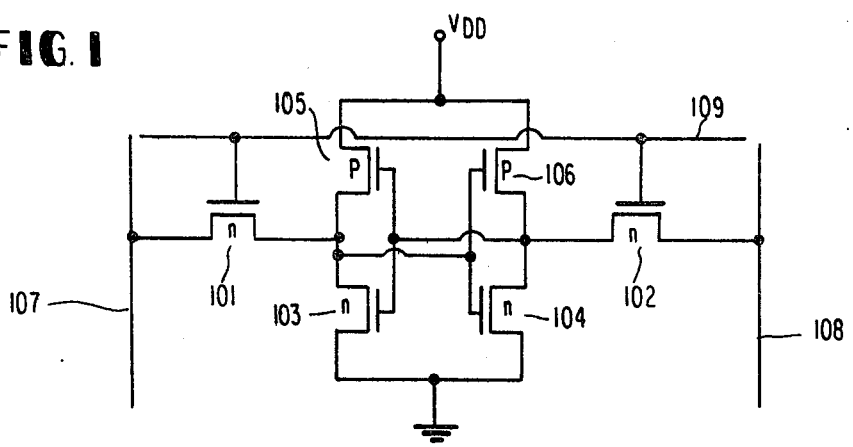
FIG. 1 is a circuit diagram illustrating a cell of CMOS static RAM.

A C MOS type memory cell circuit to be fabricated according to one embodiment of the present invention is shown in FIG. 1.

P-channel insulated-gate field effect transistors 105 and 106 used as load elements are respectively connected in series with n-channel insulated-gate field-effect transistors 103 and 104, to constitute inverter circuits. Gates of the transistors 105 and 103 are commonly connected to the drain of the transistor 102, and gates of the transistors 106 and 104 are commonly connected to the drain of the transistor 103. The drain of the transistor 103 and the drain of the transistor 104 are respectively connected to digit lines 107 and 108 via n-channel insulated-gate field-effect transistors 101 and 102, gates of which are connected to a word line 109. The sources of the transistors 105 and 106 are commonly connected to a power supply $V_{DD}$, and the sources of the transistors 103 and 104 are commonly connected to the ground potential.

Figure 2:
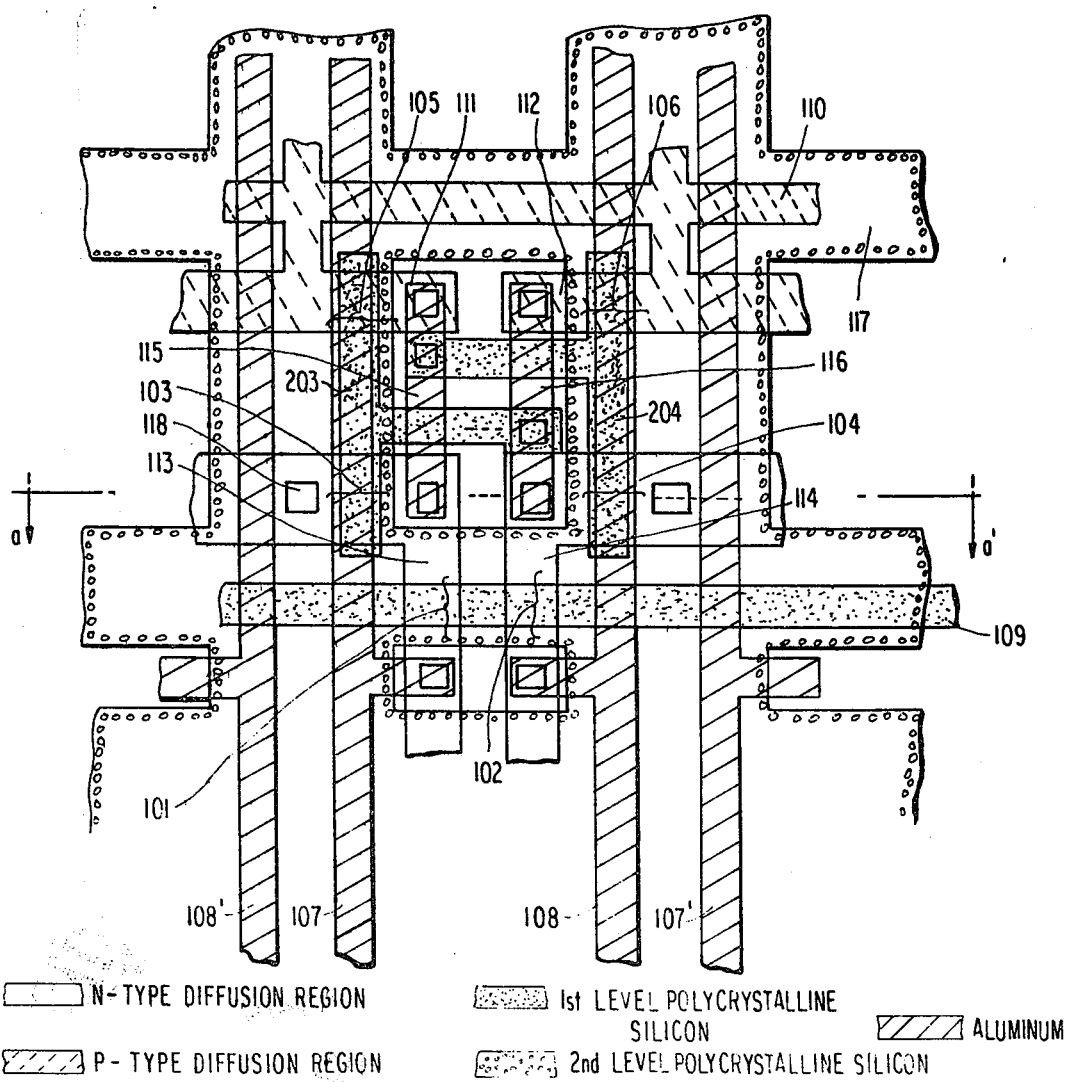
FIG. 2 is a plan view illustrating an integrated circuit according to an embodiment of the present invention.

The embodiment of the present invention will be described with reference to FIG. 2. In FIG. 2, the parts designated by the same reference numerals as those in FIG. 1 correspond to those designated by the same reference numerals in FIG. 1.

A word line 109 elongated in the column direction is made of a first level of polycrystalline silicon doped with n-type impurities. Word line 109 of polycrystalline silicon partially perform as gates of transistors 101 and 102. A polycrystalline silicon wirings 204 doped with n-type impurities performs as gates of transistors 106 and 104 and as the interconnection between the gates of transistors 106 and 104 and the drain of transistor 103 through an aluminum wiring 115. A polycrystalline silicon wiring 203 doped with n-type impurities performs as gates of transistors 105 and 103 and as the interconnection between the gates of transistors 105 and 103 and the drain of transistor 104 through an aluminum wiring 116. Polycrystalline silicon wirings 203 and 204 are of the same level as that of the polycrystalline silicon word line 109. Digit lines 107 and 108 are formed of aluminum wirings elongated in the row direction and are connected to source regions of the n-channel transistors 101 and 102 respectively. Digit lines 108' and 107' are for neighboring memory cells. Source regions of p-type conductivity of p-channel transistors 105 and 106 are connected to a power supply diffusion line 110 of p-type conductivity elongated in the column direction which supplied neighboring two column of memory cells with the power supply $V_{DD}$. In this semiconductor memory, all cells are arrayed according to mirror operation with respect to the column and the row. Drain regions 111, 112 of p-type conductivity of the load transistors 105 and 106, and drain regions 113, 114 of n-type conductivity of the transfer gate transistors 101 and 102, are respectively connected together by aluminum wirings 115 and 116. As will be obvious from the above description, the memory cell of this embodiment employs four aluminum wirings in total, i.e., digit lines 107 and 108, and wirings 115 and 116 for connecting diffusion regions of p-type conductivity and diffusion region of n-type conductivity.

The GND wiring has so far been made of aluminum, and hence the areas of the memory cell are determined by the pitch of aluminum wiring.

According to the embodiment of the present invention, the ground (GND) wiring is formed by a second level of polycrystalline silicon layer 117 elongated in both directions of the column and the row and doped with n-type impurities. The polycrystalline silicon layer 117 is connected to source regions 118 and 119 of the n-channel transistor 103 and 104 through contact holes, thereby to supply them with the ground potential.

In this embodiment, only four aluminum wirings are used, i.e., digit lines 107, 108, and aluminum wirings 115, 116. When the pitch of aluminum wiring is set 6 microns, for example, all of the wirings can be accommodated in a width of 24 microns so that area of the memory cell can be remarkably reduced.

With reference to FIGS. 3 to 8, the method for fabricating the memory device of FIG. 2 will be described for further understanding.

Figure 3A:
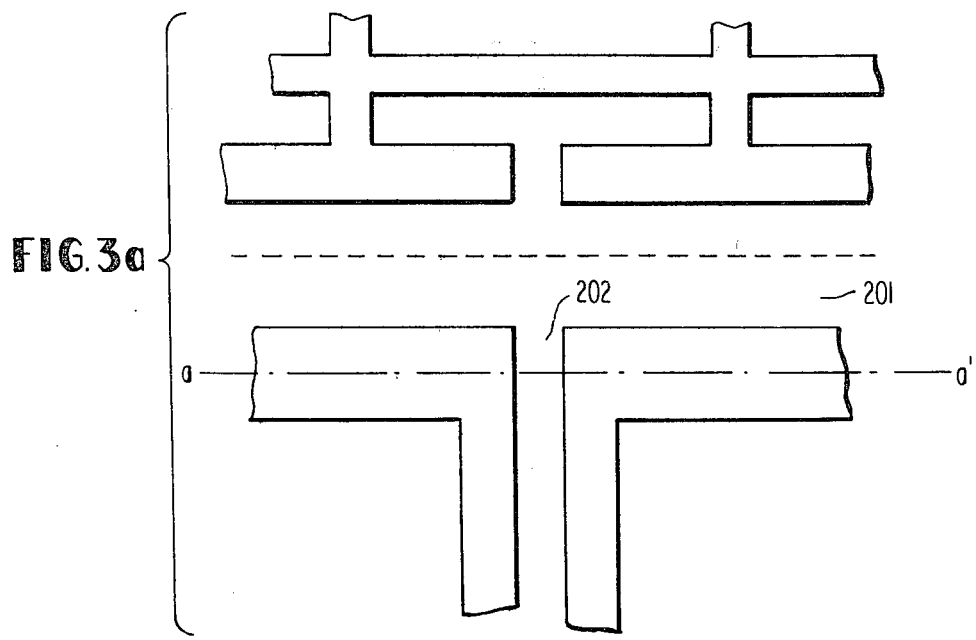
Figure 3B:
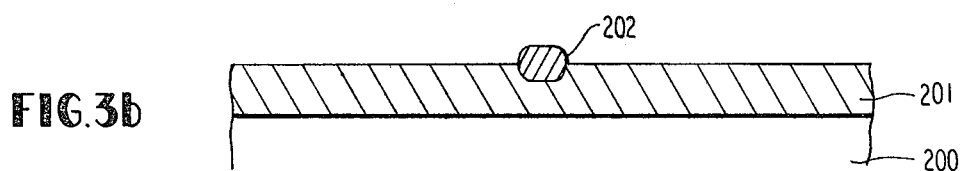

As shown in FIG. 3(B), first, a p-well region 201 is selectively formed on an n-type semiconductor substrate 200. The impurity concentration of the semiconductor substrate 200 is about $10^{15}/cm^3$. The p-well region is so formed as to cover all of the regions on which the n-channel transistors will be formed. Then, using a pattern as shown in FIG. 3(A), a heat-resistant mask such as of silicon nitride film (not shown) is formed on the substrate 200, and a silicon oxide film 202 called as field oxide film, of a thickness of about 1 micron, is formed by the known thermal oxidation method or steam oxidation method, as shown in FIG. 3(B).

Figure 4A:
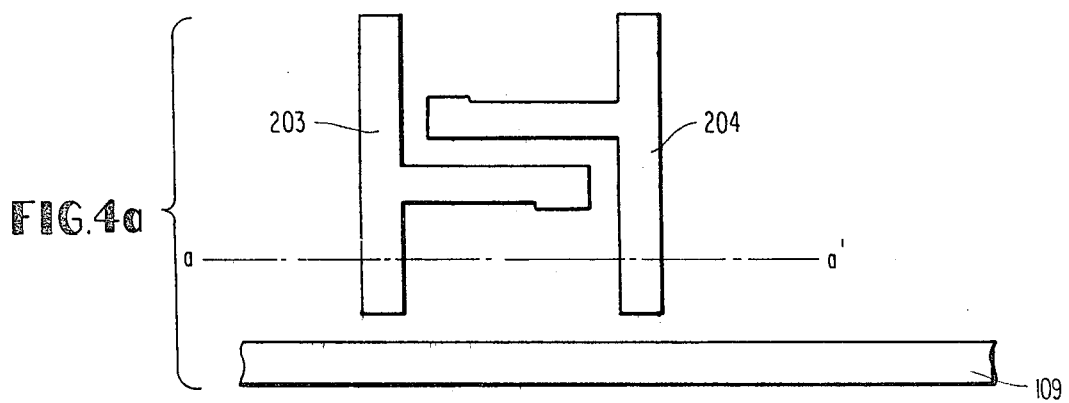
Figure 4B:
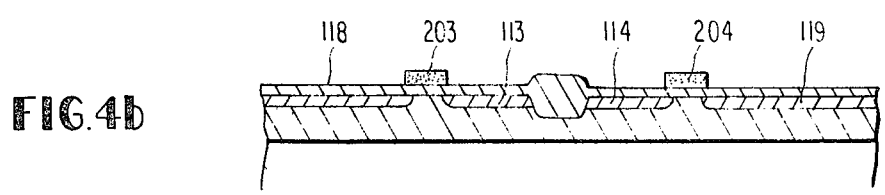

Then, a first level of polycrystalline silicon layer of a thickness of 6000 Å is formed on the substrate by thermally decomposing silane at 600° C. The polycrystalline silicon layer is then patterned by etching to describe a pattern as shown in FIG. 4(A), thereby to form a polycrystalline silicon pattern 204 that serves as gate wiring of transistors 106 and 104, a polycrystalline silicon pattern 203 that serves as gate wiring for transistors 105 and 103, and a polycrystalline silicon pattern 109 that serves as a word line. Then, arsenic ions are implanted to the upper surface of the semiconductor substrate by the ion implantation method by an acceleration voltage of 50 KeV, to form n-type drain regions 113, 114 and source regions 118, 119 for each of the transistors as shown in FIG. 4(B). Here, the junction depth of the source regions and drain regions is about 0.5 micron, and the impurity concentration is about $10^{19}/cm^3$. In this case, ions are also implanted into the polycrystalline silicon wirings 203, 204 and 109, whereby the resistance of the polycrystalline silicon is so decreased that a sheet resistance of 15 to 20 Ω/□ is obtained.

Then, a silicon oxide film is formed to a thickness of about 5000 Å by a chemical vapor deposition method on the whole surface of the substrate, and openings 207 are formed in the silicon oxide film as shown in FIG. 5(B) using a pattern as shown in FIG. 5(A). The openings 207 are formed in order to connect GND wiring that will be mentioned later to the source regions 118 and 119 of the transistors.

Then, a second level of polycrystalline silicon layer of a thickness of 1 micron is formed over the entire surface of the substrate by thermally decomposing silane at 600° C. This polycrystalline silicon layer is etched so that polycrystalline silicon pattern 117 elongated in the column and row directions as GND wiring is obtained as shown in FIG. 7.

Then, a silicon oxide film 209 serving as an interlayer insulating film is formed to a thickness of about 5000 Å on the whole surface of the semiconductor substrate by known chemical vapor deposition method. Openings 210 are then formed in the silicon oxide film 209 to such a depth as will reach the surface of the semiconductor substrate using a pattern shown in FIG. 7.

Figure 8A:
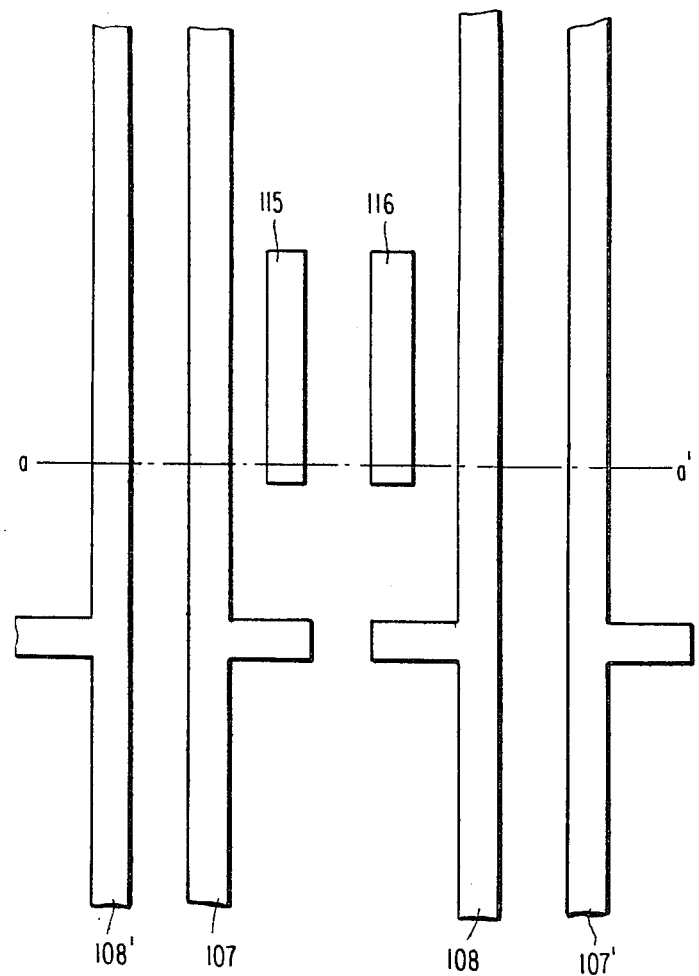
Figure 8B:
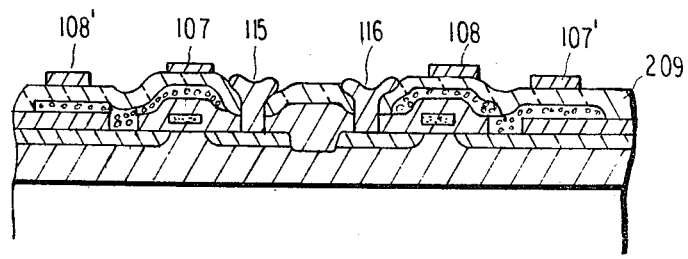

Aluminum is then deposited to a uniform thickness of 1.2 microns on the surfaces of the substrate. The aluminum layer is patterned as shown in FIG. 8(A) to form digit lines 107, 108, 107', 108' and wirings 115, 116. Aluminum patterns 108' and 107' constitute digit lines that are related to the neighbouring memory cell. Thus, a multilayer construction is materialized as shown in FIG. 8(B).

Here, phosphorus is diffused in the polycrystalline silicon layer 117 to an impurity concentration of about $10^{19}/cm^3$, so that a sheet resistance is decreased to 15 to 20 ohm/□.

Figure 9:
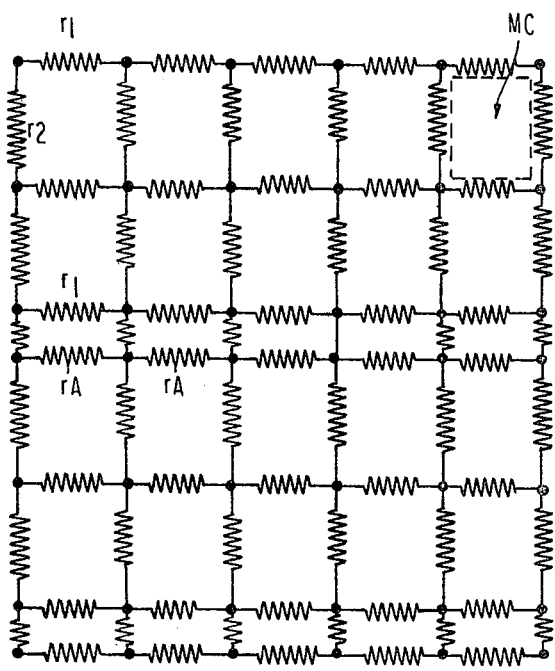
FIG. 9 is a diagram of an equivalent circuit of a polycrystalline silicon layer of a second level.

FIG. 9 illustrates the connection of the polycrystalline silicon layer 117. Power-supply (GND) wirings fromed by the polycrystalline silicon layer 117 are arrayed not only in parallel with the digit lines 107, 108 but also in parallel with the word line 109, and hence source regions 118, 119 of the transistors 103, 104 shown in FIG. 2 can be fed with the power supply via circuit networks consisting of resistors $r_1$ and $r_2$. Furthermore, aluminum wirings (not shown) may be partially formed on the polycrystal silicon layer 117 thereby to decrease the resistance of the GND wirings of the second level of polycrystalline silicon layer. Resistances $r_A$ are due to this aluminum wirings and they are in parallel with the resistances $r_1$ of the polycrystalline silicon layer. Therefore, resistance on supplying memory cells MC with a power supply is further made small.

According to the present invention, furthermore, since the layer of a stable potential is placed over a wide area on the upper surface of the memory device, it can be protected from the external electromagnetic induction, noise or alpha particles.

As will be obvious from the foregoing description, since one power supply wiring are formed of the polycrystalline silicon of the second level which is arrayed like a mesh in the column and row directions, the whole resistance can be decreased without the need of increasing the areas of the cell.

Figure 10:
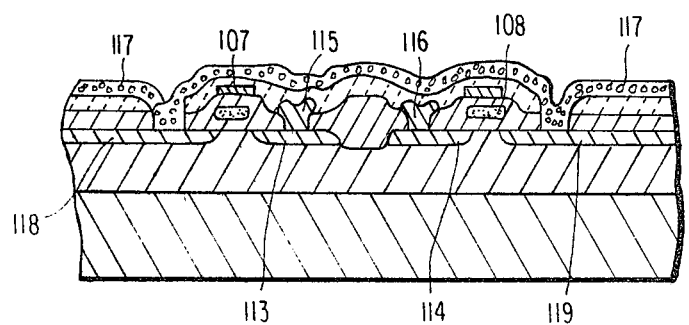
FIG. 10 is a cross-sectional view illustrating another embodiment according to the present invention.

Another embodiment according to the present invention is illustrated in FIG. 10. In the above-described embodiment, the aluminum wirings 107 and 108 are located above the polycrystalline silicon layer 117. In this embodiment, the polycrystalline silicon layer 117 is located above the aluminum wirings. In this case, the GND wirings need not be formed in a mesh-like construction, but may cover the whole surfaces of the memory cell. It is preferable in this embodiment to employ so-called refractory metal such as molybdenum or tungsten for the wiring layers 107 and 108 instead of aluminum. The aluminum wirings in the first embodiment may also be replaced by refractory metal wirings.

Although the aforementioned embodiments of the present invention have dealt with the memory cells employing CMOS transistors, the invention can of course be applied to integrated circuits employing n-channel insulated-gate field effect transistors only or p-channel transistors only.

In the above-mentioned embodiments, the polycrystalline silicon layer 117 of the second level was used for the grounding power supply (GND). The polycrystalline silicon layer 117, however, can also be used for supplying the power supply $V_{DD}$ instead of the GND power supply.

In addition to the CMOS setup, the present invention can also be applied to the N-MOS or P-MOS setup, or to the memory cells of any load.

I claim:

1. A semiconductor memory device comprising a plurality of memory cells having a pair of transistors having commonly connected sources and a gate transistor, a lower wiring layer formed of polycrystalline silicon and comprising the gates of said pair of transistors and said gate transistor and word lines for the respective memory cells coupled to the gates of the gate transistors, an upper wiring layer formed of highly conductive material and including interconnections for electrically connecting the respective gate of each one of said pair of transistors to the respective drain of each other of said pair of transistors and digit lines for each memory cell coupled to one of the source and the drain of said gate transistor, and another upper wiring layer formed of polycrystalline silicon positioned to substantially cover said lower polycrystalline silicon layer in the region of said gates and serving as a power supply path to said pair of transistors.

2. A memory device comprising a plurality of memory cells arrayed in columns and rows; a plurality of word lines arrayed in columns; a plurality of digit lines arrayed in rows; a first level of polycrystalline silicon layer; said memory cells comprising first and second nodes, a common node, a first insulated-gate field-effect transistor having its gate connected to said second node, its drain connected to said first node and a source connected to said common node, a second insulated-gate field-effect transistor having its gate connected to the first node, its drain connected to said second node and its source connected to said common node and a third insulated gate field-effect transistor having its gate coupled to one of said word lines, the gates of said first to third transistors being made of said first level of polycrystalline silicon layer, conductor means for supplying said memory cells with a first potential source; and a second level of polycrystalline silicon layer positioned over said first level of polycrystalline silicon layer to substantially cover said first level of polycrystalline silicon layer in the region of said gates and being elongated in both of said columns and rows direction; said second level of polycrystalline silicon layer supplying said memory cells with a second potential source.

3. A semiconductor device comprising a memory cell matrix including a plurality of memory cells arranged in rows and columns, each of said memory cells having memory means storing data and at least one transfer field-effect transistor for operatively deriving stored data from the memory means therethrough and a voltage terminal, a lower wiring layer formed by polycrystalline silicon and comprising the gates of said transfer transistors in said matrix, an upper wiring layer formed of highly conductive material and including interconnections between said memory cells, another upper wiring layer formed of polycrystalline silicon positioned above said lower polycrystalline layer to substantially cover said lower polycrystalline layer in the region of said gates of said transfer transistors and having electrical connections to said voltage terminals of said memory cells, and means for supplying said upper polycrystalline layer with a fixed potential.

4. An integrated circuit comprising a semiconductor substrate, a plurality of first conductivity type insulated-gate field-effect transistors formed on said semiconductor substrate, a plurality of second conductivity type insulated-gate field-effect transistors formed on said semiconductor substrate, a first level of polycrystalline silicon layer forming gates of said first conductivity type and said second conductivity type insulated-gate field-effect transistors, and a second level of polycrystalline silicon layer formed over said semiconductor substrate and in a mesh-pattern, said second level polycrystalline silicon layer being connectable to a fixed potential.

5. The integrated circuit according to claim 4, in which said second level of polycrystalline silicon is uniformly doped with an impurity.

6. The integrated circuit according to claim 4, in which said second level of polycrystalline silicon layer covers said first level of polycrystalline silicon layer in the region of all of said gates of said transistors.

7. An integrated circuit comprising a semiconductor substrate, a plurality of first conductivity type insulated-gate field-effect transistors formed on said semiconductor substrate, a plurality of second conductivity type insulated-gate field-effect transistors formed on said semiconductor substrate, a first level of polycrystalline silicon layer forming gates of said first conductivity type and said second conductivity type insulated-gate field-effect transistors, and a second level of polycrystalline silicon layer formed over said semiconductor substrate and uniformly doped with an impurity, said second level of polycrystalline silicon layer being connectable to a fixed potential.

8. The integrated circuit according to claim 7, in which said second level of polycrystalline silicon layer has a mesh-pattern.

9. The integrated circuit according to claim 7, further comprising at least one metal wiring layer for connecting between said transistors.

10. A semiconductor memory device comprising a plurality of memory cells having a pair of transistors having commonly connected first electrodes and a gate transistor, a lower wiring layer formed of polycrystalline silicon and including gates of said pair of transistors and said gate transistor and word lines for the respective memory cells coupled to the gates of the gate transistors, and upper wiring layer formed of highly conductive material and including interconnections for electrically connecting the respective gate of each one of said pair of transistors to the respective second electrode of each other of said pair of transistors and digit lines for each memory cell coupled to one of the first electrode and the second electrode of said gate transistor, and another upper wiring layer formed of polycrystalline silicon which is uniformly doped with an impurity and supplied with a power supply voltage.

11. A semiconductor device comprising a memory cell matrix including a plurality of memory cells arranged in rows and columns, each of said memory cells having memory means storing data and at least one transfer field-effect transistor for operatively deriving stored data from the memory means therethrough and a voltage terminal, a lower wiring layer formed by polycrystalline silicon and comprising the gates of said transfer transistors in said matrix, an upper wiring layer formed on highly conductive material and including interconnections between said memory cells, another upper wiring layer formed of polycrystalline silicon uniformly doped with an impurity and positioned above said lower polycrystalline layer and having electrical connections to said voltage terminals of said memory cells, and means for supplying said upper polycrystalline layer with a fixed potential.

12. The semiconductor device according to claim 11, in which said polycrystalline forming said another upper wiring layer has a mesh-pattern.

13. An integrated circuit comprising a semiconductor substrate, a first level of polycrystalline silicon layer formed on said semiconductor substrate, a plurality of insulated-gate field-effect transistors formed on said semiconductor substrate, each of said transistors having a gate made of said first level of polycrystalline silicon layer, and a second level of polycrystalline silicon layer formed over said semiconductor substrate with a mesh-pattern, said second level of polycrystalline silicon layer being uniformly doped with an impurity and positioned above said first level of polycrystalline silicon layer to substantially cover said first level of polycrystalline silicon layer in the region of all of said gates of said insulated-gate field-effect transistors.

14. The integrated circuit according to claim 13, in which said second level polycrystalline silicon layer serves as a power supply line.

15. The integrated circuit according to claim 13, further comprising at least one metal wiring layer for connecting between said transistors.

* * * * *